United States Patent
Kato

(10) Patent No.: US 7,525,157 B2
(45) Date of Patent: Apr. 28, 2009

(54) SEMICONDUCTOR DEVICE AND MANUFACTURING METHOD THEREOF

(75) Inventor: Tatsushi Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 159 days.

(21) Appl. No.: 11/712,799

(22) Filed: Mar. 1, 2007

(65) Prior Publication Data

US 2007/0205462 A1    Sep. 6, 2007

(30) Foreign Application Priority Data

Mar. 1, 2006    (JP)    ............................. 2006-054426

(51) Int. Cl.
*H01L 29/786* (2006.01)
(52) U.S. Cl. ..................................... 257/352
(58) Field of Classification Search ......... 257/347–354, 257/E27.112; 438/149
See application file for complete search history.

(56) References Cited

U.S. PATENT DOCUMENTS

| | | | | |
|---|---|---|---|---|
| 5,828,101 A | * | 10/1998 | Endo | ........................... 257/330 |
| 6,137,120 A | * | 10/2000 | Shindo et al. | .................. 257/66 |
| 6,958,516 B2 | * | 10/2005 | Wong | ........................... 257/347 |
| 6,965,147 B2 | * | 11/2005 | Shino | ........................... 257/347 |

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

* cited by examiner

*Primary Examiner*—Nathan W Ha
(74) *Attorney, Agent, or Firm*—AdvantEdge Law Group, LLC

(57) ABSTRACT

A semiconductor device includes: an insulating layer selectively formed on the semiconductor base material; a first semiconductor layer made of single-crystal and formed on the semiconductor base material that is exposed below the insulating layer, the first semiconductor layer having an opening that exposes the semiconductor base material; an opening plane exposing a side face of the first semiconductor layer and provided below the support film, the second semiconductor layer and the first semiconductor layer by using the mask pattern as a mask; a portion defining a hollow part between the second semiconductor layer and the semiconductor base material; a first insulating film formed in the hollow part; and a second insulating film formed above the semiconductor base material on which the first insulating film is formed. The SOI forming region is provided in a plural number, and the insulating layer has a planar shape that encloses the SOI forming regions and separates one of the SOI forming regions from other SOI forming region in the enclosed area.

5 Claims, 7 Drawing Sheets

SEMICONDUCTOR DEVICE AND MANUFACTURING METHOD THEREOF

BACKGROUND OF THE INVENTION

1. Technical Field

Several aspects of the present invention relate to a semiconductor device and a manufacturing method thereof, and more particularly to a technique that reduces a degree of dishing in a silicon-on-insulator (SOI) forming region in a semiconductor device manufactured by a Separation by Bonding Si Islands (SBSI) method.

2. Related Art

The development of a technique of forming a device in a semiconductor film on an insulating film substrate such as a Silicon-On Insulator (SOI) has been actively taken place in a recent semiconductor field. Particularly, a device formed on a SOI substrate has potential for low power consumption and high-speed and low voltage driving.

Various methods for manufacturing such SOI substrate have been known. The methods include a Separation by Implanted Oxygen (SIMOX) method, bonding methods such that two silicon substrates are adhered together with an oxide film interposed therebetween and the like. These methods require special processes or equipment and the SOI substrate could not be manufactured through an ordinary Complementary Metal-Oxide Semiconductor (CMOS) process according to the above-mentioned methods. Under such circumstances, a method for manufacturing the SOI substrate only through the ordinary CMOS process has been attracted attention recently. T. Sakai et al., *Second International SiGe Technology and Device Meeting, Meeting abstract*, pp. 230-231, May, 2004 is an example of related art. A Separation by Bonding Silicon Island (SBSI) method according to the example can form a SOI structure only by the ordinary COMS process.

According to the SBSI method disclosed in the example, a SOI structure was firstly formed on a Si substrate, followed by formation of a thick insulating film, and then the thick insulating film was treated by chemical mechanical polishing (CMP). In the CMP treatment, a poly-Si layer 92 (hereinafter referred "epi-polysilicon film"), which was formed on an isolation layer 93 as a by-product of the formation of the single-crystalline Si on the Si substrate by an epitaxial growth method, serves as a stopper for a polishing cloth (polishing pad).

However, according to the example of the related art, an arrangement and configuration of the epi-polysilicon film 92 were decided by an layout of element isolations in the integrated circuit, and the arrangement and configuration of the epi-polysilicon film 92 were not be designed considering its function as the stopper. Consequently, a phenomenon so-called "dishing" can occur at the time of the CMP treatment of the thick insulating film and the Si layer existing in a SOI forming region 91 could be unnecessarily polished if the area of the epi-polysilicon film 92 is too small or the distance L between two adjacent epi-polysilicon films 29 with the SOI forming region 91 therebetween as shown in FIG. 8 is too long.

SUMMARY

An advantage of the present invention is to provide a semiconductor device in which the degree of the dishing in the SOI forming region is made as small as possible and a manufacturing method thereof.

A semiconductor device according to a first aspect of the invention includes: a semiconductor base material; an insulating layer selectively formed on the semiconductor base material; a first semiconductor layer made of single-crystal and formed on the semiconductor base material that is exposed below the insulating layer, the first semiconductor layer having an opening that exposes the semiconductor base material; a second semiconductor layer made of a single-crystal whose wet-etching selectivity is smaller than a wet-etching selectivity of the first semiconductor layer, the second semiconductor layer being formed on the first semiconductor layer and having the opening that exposes the semiconductor base material; a polycrystalline layer made of the same composition as the second semiconductor layer, the polycrystalline layer being formed on the insulating layer; a support film formed on a whole upper face of the semiconductor base material and filling the opening; a mask pattern formed on the support film so as to continuously cover at least a part of the opening and a silicon-on-insulator (SOI) forming region, cover the polycrystalline layer and expose other region; an opening plane exposing a side face of the first semiconductor layer and provided below the support film, the opening plane being formed by sequentially dry-etching the support film, the second semiconductor layer and the first semiconductor layer by using the mask pattern as a mask; a portion defining a hollow part between the second semiconductor layer and the semiconductor base material, the hollow part being formed by wet-etching the first semiconductor layer through the opening plane; a first insulating film formed in the hollow part; and a second insulating film formed above the semiconductor base material on which the first insulating film is formed, the second insulating film being treated with chemical mechanical polishing (CMP) so as to expose the polycrystalline layer. The SOI forming region is provided in a plural number, and the insulating layer has a planar shape that encloses the SOI forming regions and separates one of the SOI forming regions from other SOI forming region in the enclosed area.

In this case, the "semiconductor base material" is for example a bulk silicon (Si) substrate. The "first semiconductor layer" is for example a silicon germanium (SiGe) layer obtained by epitaxial growth and the "second semiconductor layer" is for example a Si layer obtained by epitaxial growth. Moreover, the "support film", the "first insulating film" and the "second insulating film" are for example a silicon oxide ($SiO_2$) film. The "SOI forming region" means a region where a SOI structure having the second semiconductor layer, the first insulating layer and the semiconductor base material in this order from the top is formed. The "CMP treatment" is a planarization treatment using a chemical mechanical polishing (CMP) machine.

According to the first aspect of the invention, it is possible to place the polycrystalline layer that serves as a stopper during the CMP treatment of the second insulating film close to the SOI forming regions. Consequently, the degree of the dishing in the SOI forming regions can be reduced and this prevents unintended decrease in a thickness of the second semiconductor layer in the SOI forming regions.

A semiconductor device according to a second aspect of the invention includes: a semiconductor base material; an insulating layer selectively formed on the semiconductor base material; a first semiconductor layer made of single-crystal and formed on the semiconductor base material that is exposed below the insulating layer, the first semiconductor layer having an opening that exposes the semiconductor base material; a second semiconductor layer made of a single-crystal whose wet-etching selectivity is smaller than a wet-etching selectivity of the first semiconductor layer, the second semiconductor layer being formed on the first semiconductor layer and having the opening that exposes the semiconductor base material; a polycrystalline layer made of the same composition as the second semiconductor layer, the polycrystalline layer being formed on the insulating layer; a support film formed on a whole upper face of the semiconductor base material and filling the opening; a mask pattern formed on the support film so as to continuously cover at least a part of the opening and a silicon-on-insulator (SOI) forming region, cover the polycrystalline layer and expose other region; an opening plane exposing a side face of the first semiconductor layer and provided below the support film, the opening plane being formed by sequentially dry-etching the support film, the second semiconductor layer and the first semiconductor layer by using the mask pattern as a mask; a portion defining a hollow part between the second semiconductor layer and the semiconductor base material, the hollow part being formed by wet-etching the first semiconductor layer through the opening plane; a first insulating film formed in the hollow part; and a second insulating film formed above the semiconductor base material on which the first insulating film is formed, the second insulating film being treated with chemical mechanical polishing (CMP) so as to expose the polycrystalline layer. The insulating layer has a planar shape that encloses the SOI forming region and has a protruding part partially protruding toward the SOI forming region in the enclosed area.

According to the second aspect of the invention, it is possible to place the polycrystalline layer that serves as a stopper during the CMP treatment of the second insulating film close to the SOI forming region. Consequently, the degree of the dishing in the SOI forming region can be reduced and this prevents unintended decrease in a thickness of the second semiconductor layer in the SOI forming region.

A semiconductor device according to a third aspect of the invention includes: a semiconductor base material; an insulating layer selectively formed on the semiconductor base material; a first semiconductor layer made of single-crystal and formed on the semiconductor base material that is exposed below the insulating layer, the first semiconductor layer having an opening that exposes the semiconductor base material; a second semiconductor layer made of a single-crystal whose wet-etching selectivity is smaller than a wet-etching selectivity of the first semiconductor layer, the second semiconductor layer being formed on the first semiconductor layer and having the opening that exposes the semiconductor base material; a polycrystalline layer made of the same composition as the second semiconductor layer, the polycrystalline layer being formed on the insulating layer; a support film formed above a whole upper face of the semiconductor base material and filling the opening; a mask pattern formed on the support film so as to continuously cover at least a part of the opening and a silicon-on-insulator (SOI) forming region, cover the polycrystalline layer and expose other region; an opening plane exposing a side face of the first semiconductor layer and provided below the support film, the opening plane being formed by sequentially dry-etching the support film, the second semiconductor layer and the first semiconductor layer by using the mask pattern as a mask; a portion defining a hollow part between the second semiconductor layer and the semiconductor base material, the hollow part being formed by wet-etching the first semiconductor layer through the opening plane; a first insulating film formed in the hollow part; and a second insulating film formed above the semiconductor base material on which the first insulating film is formed, the second insulating film being treated with chemical mechanical polishing (CMP) so as to expose the polycrystalline layer. The SOI forming region is provided in a plural number, and the insulating layer has a planar shape that encloses the SOI forming regions, separates a first SOI forming region, which is one of the SOI forming regions, from other SOI forming region in the enclosed area, and has a protruding part partially protruding toward at least one of the first SOI forming region or the other SOI forming region.

According to the third aspect of the invention, it is possible to place the polycrystalline layer that serves as the stopper during the CMP treatment much closer to the SOI forming region compared with the first and second aspects of the invention. Consequently, the degree of the dishing in the SOI forming region can be further reduced and this can effectively prevent unintended decrease in a thickness of the second semiconductor layer in the SOI forming region.

A method for manufacturing a semiconductor device according to a fourth aspect of the invention includes: forming an insulating layer on a semiconductor base material; forming a first semiconductor layer made of single-crystal on the semiconductor base material that is exposed below the insulating layer; forming a second semiconductor layer made of a single-crystal whose wet-etching selectivity is smaller than a wet-etching selectivity of the first semiconductor layer on the first semiconductor layer, and simultaneously forming a polycrystalline layer made of the same composition as the second semiconductor layer on the insulating layer; forming an opening that exposes the semiconductor base material in the second semiconductor layer and the first semiconductor layer; filling the opening by forming a support film above a whole upper face of the semiconductor base material; forming a mask pattern on the support film so as to continuously cover at least a part of the opening and a silicon-on-insulator (SOI) forming region, cover the polycrystalline layer and expose other region; forming an opening plane that exposes a side face of the first semiconductor layer and is placed below the support film by sequentially dry-etching the support film, the second semiconductor layer and the first semiconductor layer by using the mask pattern as a mask; forming a hollow part between the second semiconductor layer and the semiconductor base material by wet-etching the first semiconductor layer through the opening plane; forming a first insulating film in the hollow part; and forming a second insulating film above the semiconductor base material on which the first insulating film is formed, and treating the second insulating film with chemical mechanical polishing (CMP) so as to expose the polycrystalline layer. The SOI forming region is provided in a plural number, and the insulating layer is formed so as to have a planar shape that encloses the SOI forming regions and separates one of the SOI forming regions from other SOI forming region in the enclosed area.

According to the fourth aspect of the invention, it is possible to place the polycrystalline layer that serves as a stopper during the CMP treatment of the second insulating film close to the SOI forming regions. Consequently, the degree of the dishing in the SOI forming regions can be reduced and this prevents unintended decrease in a thickness of the second semiconductor layer in the SOI forming regions.

A method for manufacturing a semiconductor device according to a fifth aspect of the invention includes: forming an insulating layer on a semiconductor base material; forming a first semiconductor layer made of single-crystal on the semiconductor base material that is exposed below the insulating layer; forming a second semiconductor layer made of a single-crystal whose wet-etching selectivity is smaller than a wet-etching selectivity of the first semiconductor layer on the first semiconductor layer, and simultaneously forming a polycrystalline layer made of the same composition as the second semiconductor layer on the insulating layer; forming an opening that exposes the semiconductor base material in the second semiconductor layer and the first semiconductor layer; filling the opening by forming a support film above a whole upper face of the semiconductor base material; forming a mask pattern on the support film so as to continuously cover at least a part of the opening and a silicon-on-insulator (SOI) forming region, cover the polycrystalline layer and expose other region; forming an opening plane that exposes a side face of the first semiconductor layer and is placed below the support film by sequentially dry-etching the support film, the second semiconductor layer and the first semiconductor layer by using the mask pattern as a mask; forming a hollow part between the second semiconductor layer and the semiconductor base material by wet-etching the first semiconductor layer through the opening plane; forming a first insulating film in the hollow part; and forming a second insulating film above the semiconductor base material on which the first insulating film is formed, and treating the second insulating film with chemical mechanical polishing (CMP) so as to expose the polycrystalline layer. The insulating layer is formed so as to have a planar shape that encloses the SOI forming region and have a protruding part partially protruding toward the SOI forming region in the enclosed area.

According to the fifth aspect of the invention, it is possible to place the polycrystalline layer that serves as a stopper during the CMP treatment of the second insulating film close to the SOI forming region. Consequently, the degree of the dishing in the SOI forming region can be reduced and this prevents unintended decrease in a thickness of the second semiconductor layer in the SOI forming region.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1A:
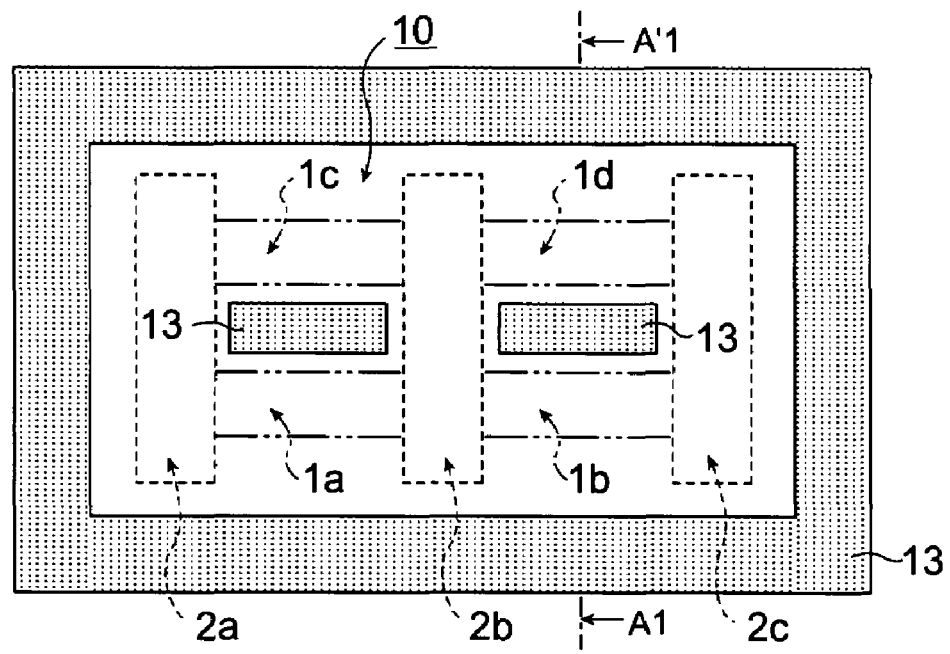
FIGS. 1A and 1B are drawings showing a method for manufacturing a semiconductor device according to a first embodiment of the invention.
Figure 1B:
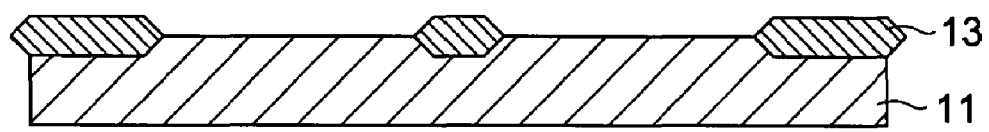
Figure 2A:
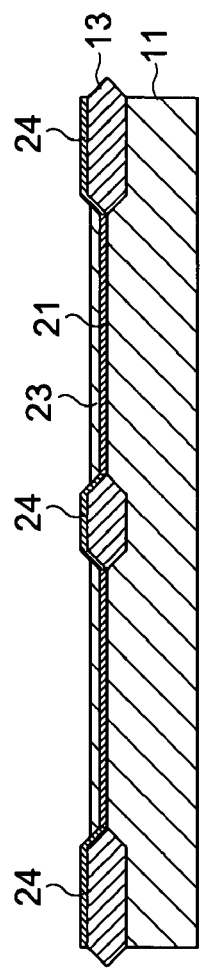
FIGS. 2A through 2C are drawings showing the method for manufacturing a semiconductor device according to the first embodiment followed by FIG. 1.
Figure 2B:
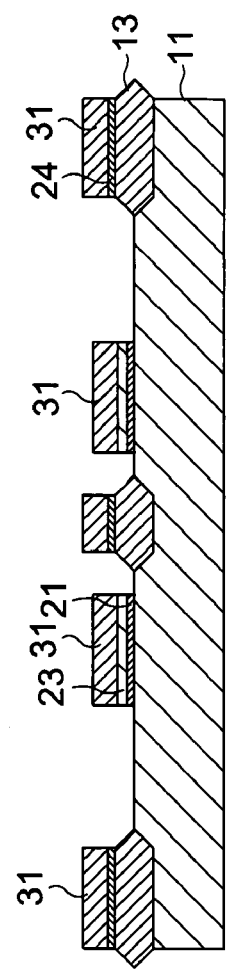
Figure 2C:
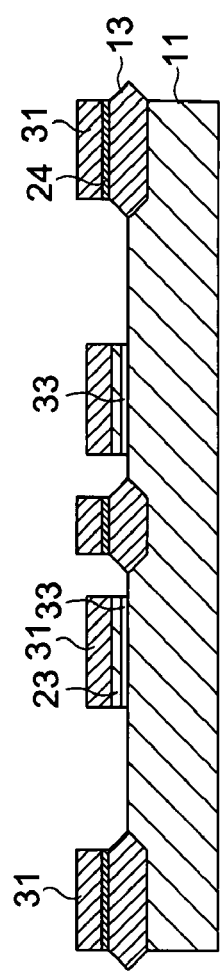
Figure 3A:
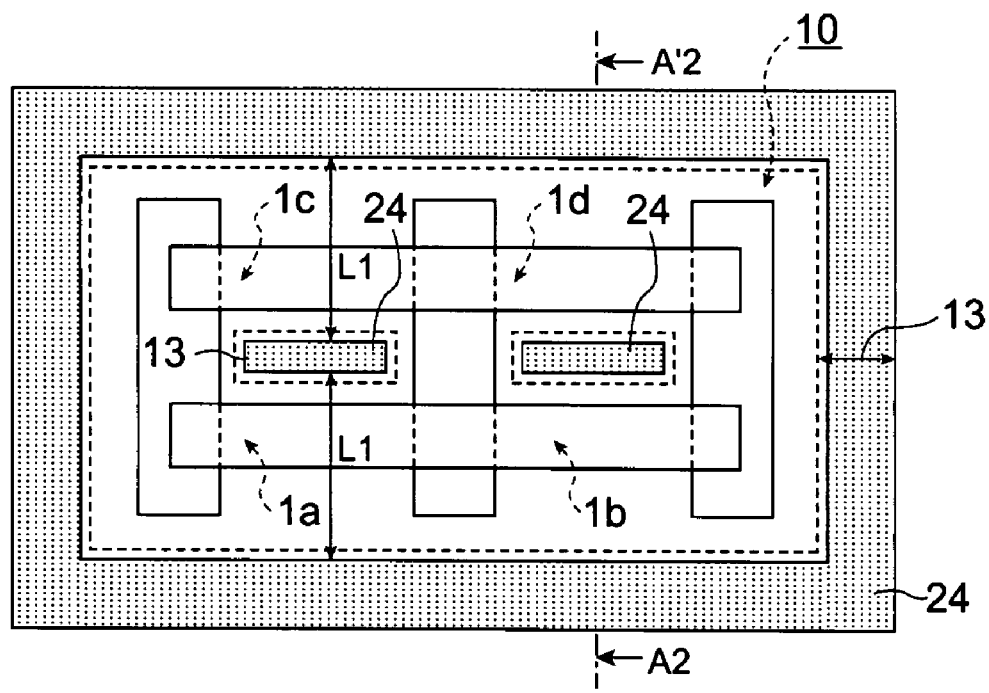
FIGS. 3A and 3B are drawings showing the method for manufacturing a semiconductor device according to the first embodiment.
Figure 3B:
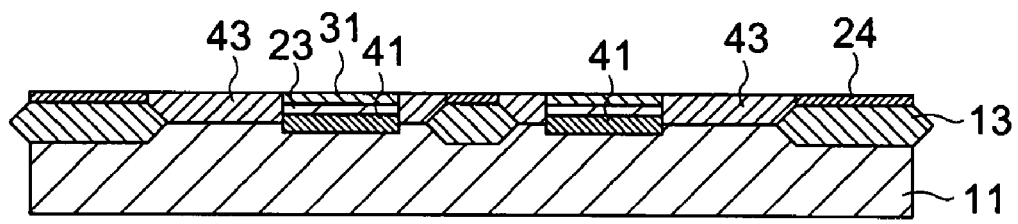

FIGS. 1 through 3 are drawings showing processes of a method for manufacturing a semiconductor device according to the first embodiment of the invention. More particularly, FIG. 1A is a plan view of a semiconductor device in which an isolation layer 13 has been formed on a silicon substrate 11, and FIG. 1B is a sectional view of the semiconductor device along the line A1-A1' in FIG. 1A. FIGS. 2A through 2C are sectional views showing the processes following one shown in FIG. 1B. FIG. 3A is a plan view of the semiconductor device in which the whole upper face of the silicon substrate 11 has been treated with the CMP, and FIG. 3B is a sectional view of the semiconductor device along the line A2-A2' in FIG. 3A.

In this embodiment, a semiconductor device is manufactured by using the Separation by Bonding Silicon Island (SBSI) method. Referring to FIG. 1A and FIG. 1B, the isolation layer 13 enclosing an element forming region 10 is firstly formed on the silicon substrate 11 which is a bulk silicon wafer. The isolation layer 13 is made of a silicon oxide ($SiO_2$) film. This layer 13 is formed by selectively providing a silicon nitride film (unshown in the drawings) on a thin $SiO_2$ film (unshown in the drawings) deposited on the silicon substrate 11, and then selectively oxidizing the silicon substrate 11 by using this silicon nitride film. In other words, the isolation layer 13 is formed by a Local Oxidation of Silicon (LOCOS) method.

The element forming region 10 includes regions 1a through 1d where SOI structures are formed (hereinafter called "SOI forming regions") and regions 2a through 2c where an opening for holding a support member is formed (hereinafter called "opening forming regions"). Referring to FIG. 1A, for example, four SOI forming regions 1a through 1d are provided in a single element forming region 10. Each of the SOI forming regions 1a through 1d has for example a rectangular shape when it is viewed in plan (or its planar shape). The planar shapes of the opening forming regions 2a through 2c are also rectangle. A pair of opposing sides among four sides of each rectangle of the SOI forming regions 1a through 1d is placed adjacent to one of the opening forming regions 2a through 2c.

The isolation layer 13 is formed into a prescribed pattern as shown in FIG. 1A and FIG. 1B. A predetermined pattern includes for example a planar shape that encloses the element forming region 10, separates the SOI forming region 1a from the SOI forming region 1c, and separates the SOI forming region 1b from the SOI forming region 1d in the enclosed area. In other words, the isolation layer 13 is not only provided outside the element forming region 10 but also provided between the SOI forming region 1a and the SOI forming region 1c and between the SOI forming region 1b and the SOI forming region 1d. A thickness of the isolation layer 13 is for example about 100-1000 nm.

After the isolation layer 13 has been formed by the LOCOS method, the unshown silicon nitride film and thin $SiO_2$ film are removed from the silicon substrate 11. The unshown silicon nitride film can be removed by for example wet etching using hot phosphoric acid, and the unshown thin $SiO_2$ film can be removed by for example wet etching using dilute hydrofluoric acid.

Referring to FIG. 2A, a SiGe layer 21 is formed on the silicon substrate 11, and a Si layer 23 is further formed on top of the SiGe layer. The SiGe layer 21 and the Si layer 23 are formed by epitaxial growth. A film thickness of the SiGe layer 21 is for example about 10-200 nm, and a film thickness of the Si layer 23 is for example about 10-200 nm. While the single-crystalline SiGe layer 21 and the single-crystalline Si layer 23 are formed on the surface of the silicon substrate 11, a poly-SiGe layer and a poly-Si layer 24 are formed on the isolation layer 13 that is made of the $SiO_2$ film.

More particularly, in the same manner as the isolation layer 13, the poly-Si layer 24 (or epi-polysilicon film) is made into a planar shape that encloses the four SOI forming regions 1a-1d, separates the SOI forming region 1a from the SOI forming region 1c, and separates the SOI forming region 1b from the SOI forming region 1d in the enclosed area.

Subsequently, a resist pattern (unshown in the drawings) that for example exposes the opening forming region 2 but covers other region is formed on the silicon substrate 11. The Si layer 23 and the SiGe layer 21 are dry-etched by using this resist pattern as a mask, and the surface of the silicon substrate 11 is then exposed in the opening forming region 2. In this way, the opening for the support member (unshown in the drawings) has been formed.

Next, a support film is formed above the silicon substrate 11 and the unshown opening for the support member is buried. The support film is made of for example a $SiO_2$ film and formed by chemical vapor deposition (CVD) or the like. A thickness of the support film is for example about 4000 Å. A resist pattern (unshown in the drawings) that continuously covers a part of the opening and the SOI forming regions 1a-1d (see FIG. 1A), covers the isolation layer 13 and exposes other region is then formed on the support film. The support film is subsequently etched by using this resist pattern as a mask and a support member 31 is formed as shown in FIG. 2B.

Next, the Si layer 23 and the SiGe layer 21 that are exposed below the support member 31 are sequentially removed by dry-etching. For example, a gas containing $CF_4$ is used as an etching gas for the etching of the support member 31, and a gas containing $Cl_2$ and $O_2$ is used for the etching of the Si layer 23 and the SiGe layer 21. In this way, a plane having an opening (unshown in the drawings) that exposes a part of the side face of the SiGe layer 21 and a part of the side face of the Si layer 23 is formed below the support member 31.

Next, only the SiGe layer 21 is removed by contacting the SiGe layer 21 and the Si layer 23 with an etching solution such as fluorinated nitric acid supplied through the opening plane that has been formed in the support member 31. In this way, a hollow part 33 is formed between the silicon substrate 11 and the Si layer 23 as shown in FIG. 2C. The silicon substrate 11 is then thermally oxidized. In the oxidation, oxidant such as $O_2$ reaches to not only the surface of the silicon substrate 11 exposed below the support member 31 but also reaches to the inside of the hollow part 33 through the opening plane. Accordingly, a $SiO_2$ film 41 is formed in the hollow part 33 as shown in FIG. 3B. This $SiO_2$ film 41 is a buried oxide (BOX) layer which is a part of the SOI structure.

Next, the opening and the like remaining in the element forming region 10 are buried by forming a $SiO_2$ film 43 on the whole upper face of the silicon substrate 11 by a CVD method or the like. The $SiO_2$ film 43 is formed to have for example a thickness about 500-1500 nm. The whole upper face above the silicon substrate 11 is then treated with the CMP so as to expose the epi-polysilicon film 24. Referring to FIG. 3A and FIG. 3B, the epi-polysilicon film 24 on the isolation layer 13 serves as a stopper against a polishing cloth (polishing pad) during this planarization treatment.

Subsequently, the support member 31 is removed by performing wet-etching using dilute hydrofluoric acid to the silicon substrate 11, and the surface of the Si layer 23 is exposed. In this way, the upper face of the Si layer 23 is exposed, and the SOI structure in which the sides and the bottom of the Si layer 23 are isolated by the $SiO_2$ film 43 and the support member 31 is completed on the silicon substrate 11.

According to the above-described first embodiment, the isolation layer 13 is formed into the pattern that encloses the element forming region 10, separates the SOI forming region 1a from the SOI forming region 1c, and separates the SOI forming region 1b from the SOI forming region 1d in the enclosed area. With such arrangement, it is possible to place the epi-polysilicon film 24 that serves as the stopper during the CMP treatment of the $SiO_2$ film 43 close to the SOI forming regions 1a-1d.

Figure 6:
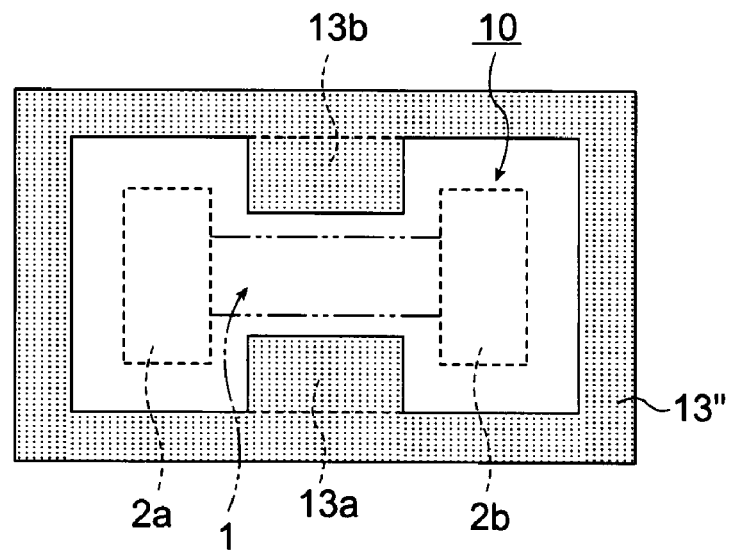
FIG. 6 is a drawing showing a method for manufacturing a semiconductor device according to a third embodiment of the invention.

It is also possible to make a layout distance L1 (see FIG. 3A) between the two epi-polysilicon films 24 placed with one of the SOI forming regions 1a-1d therebetween smaller than a layout distance L of the example of the related art (see FIG. 6). Consequently, the degree of the dishing in the SOI forming regions 1a-1d can be reduced and this prevents unintended decrease in a thickness of the Si layer 23 in the SOI forming regions 1a-1d.

In the first embodiment, the silicon substrate 11 corresponds to a "semiconductor base material" of the invention, and the isolation layer 13 corresponds to an "insulating layer" of the invention. The SiGe layer 21 corresponds to a "first semiconductor layer" of the invention, the Si layer 23 corresponds to a "second semiconductor layer" of the invention, and the epi-polysilicon film 24 corresponds to a "polycrystalline layer" of the invention. Furthermore, the $SiO_2$ film 41 corresponds to a "first insulating film" of the invention and the $SiO_2$ film 43 corresponds to a "second insulating film" of the invention.

Second Embodiment

Figure 4:
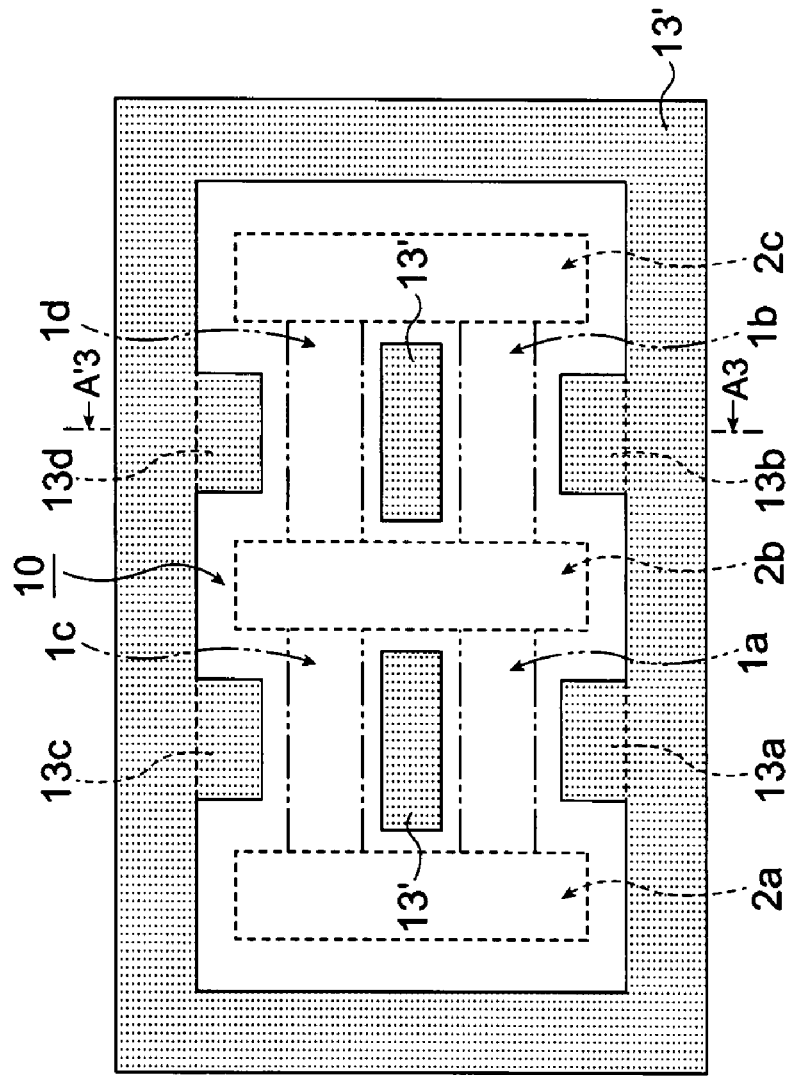
FIG. 4 is a drawing showing a method for manufacturing a semiconductor device according to a second embodiment of the invention.
Figure 5:
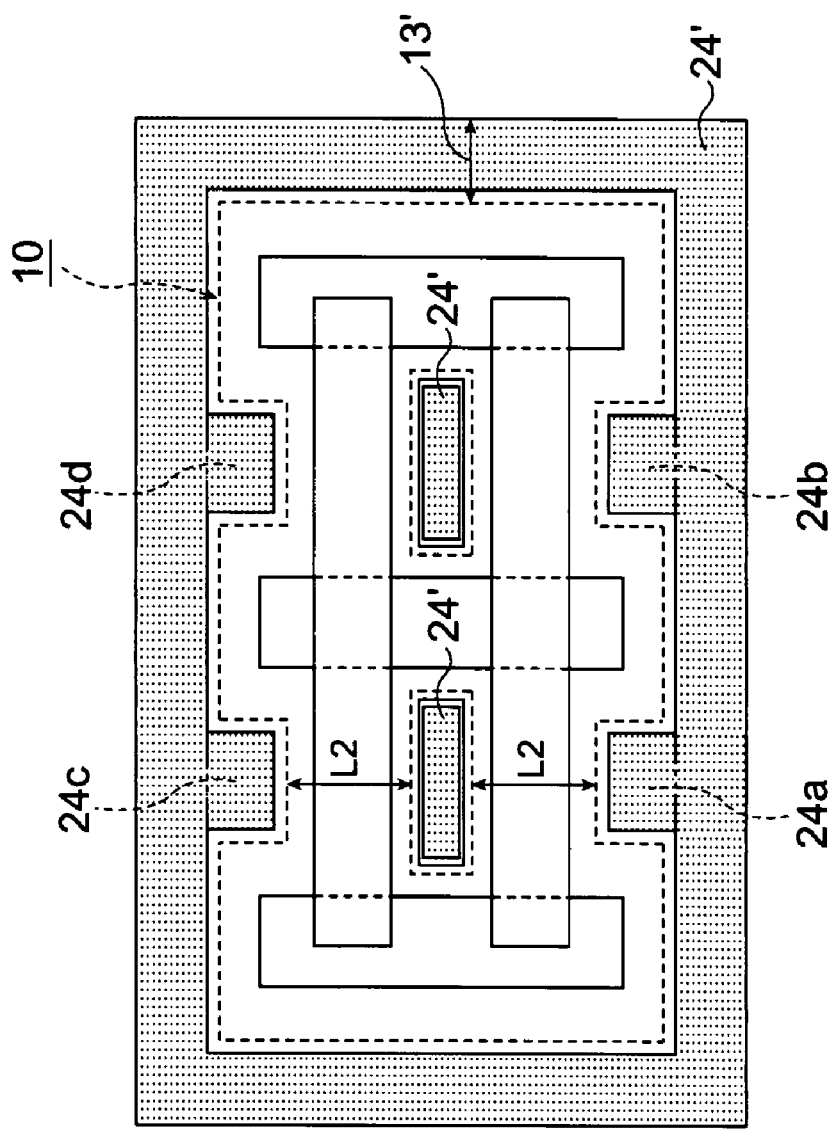
FIG. 5 is a drawing showing the method for manufacturing a semiconductor device according to the second embodiment.

FIG. 4 and FIG. 5 are plan views showing processes of a method for manufacturing a semiconductor device according to a second embodiment of the invention. More particularly, FIG. 4 is a plan view of a semiconductor device in which an isolation layer 13' has been formed on a silicon substrate, and FIG. 5 is a plan view of the semiconductor device in which the whole upper face of the silicon substrate has been treated with the CMP. Identical numerals are given to the same components and parts having the same structures as those shown in FIG. 1A and FIG. 3A, and those detailed descriptions will be hereunder omitted.

In the second embodiment, the isolation layer 13' is formed on the silicon substrate by the LOCOS method in the same manner as the first embodiment. However, the isolation layer 13' has a planar shape that encloses the element forming region 10, separates the SOI forming region 1a from the SOI forming region 1c, separates the SOI forming region 1b from the SOI forming region 1d in the enclosed area, and has protruding parts 13a through 13d that protrude correspondingly toward the SOI forming regions 1a-1d as shown in FIG. 4. In other words, the planar shape of the isolation layer 13' further has the protruding parts 13a-13d added to the isolation layer 13 described in the first embodiment. After the isolation layer 13' has formed on the silicon substrate, the SOI structures are formed in the SOI forming regions 1a-1d of the silicon substrate by the SBSI method in the same way as the first embodiment.

Accordingly, an epi-polysilicon film 24' formed on the isolation layer 13' has a planar shape that encloses the element forming region 10, separates the SOI forming region 1a from the SOI forming region 1c, separates the SOI forming region 1b from the SOI forming region 1d in the enclosed area, and has protruding parts 24a through 24d that protrude correspondingly toward the SOI forming regions 1a-1d as shown in FIG. 5.

With such arrangement, it is possible to place the epi-polysilicon film 24' that serves as the stopper during the CMP treatment of the SiO$_2$ film 43 (see FIG. 3B) close to the SOI forming regions 1a-1d. It is also possible to make a layout distance L2 between the two epi-polysilicon films 24' placed with one of the SOI forming regions 1a-1d therebetween smaller than the layout distance L1 (see FIG. 3A) of the first embodiment. Consequently, the degree of the dishing in the SOI forming regions 1a-1d can be reduced and this prevents unintended decrease in a thickness of the Si layer 23 in the SOI forming regions 1a-1d.

In the second embodiment, the isolation layer 13' corresponds to the "insulating layer" of the invention and the epi-polysilicon film 24' corresponds to the "polycrystalline layer" of the invention. Other correspondences between the elements in the second embodiment and the elements of the invention are same as those in the first embodiment.

Third Embodiment

Figure 7:
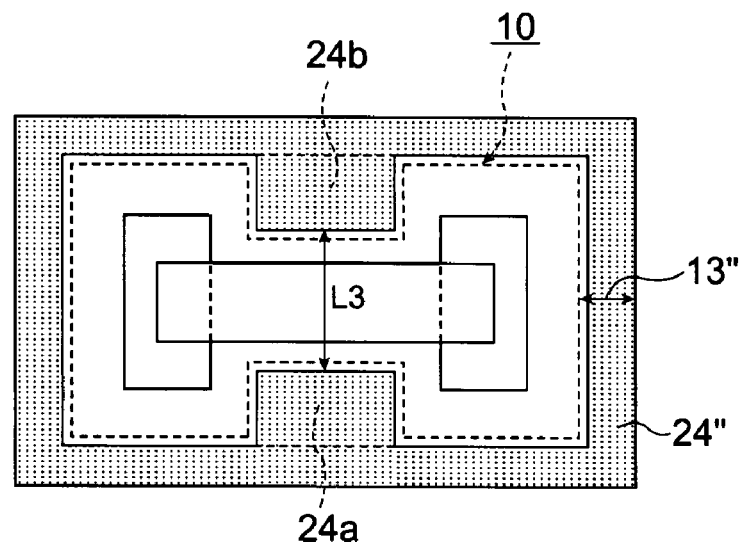
FIG. 7 is a drawing showing the method for manufacturing a semiconductor device according to the third embodiment of the invention.
Figure 8:
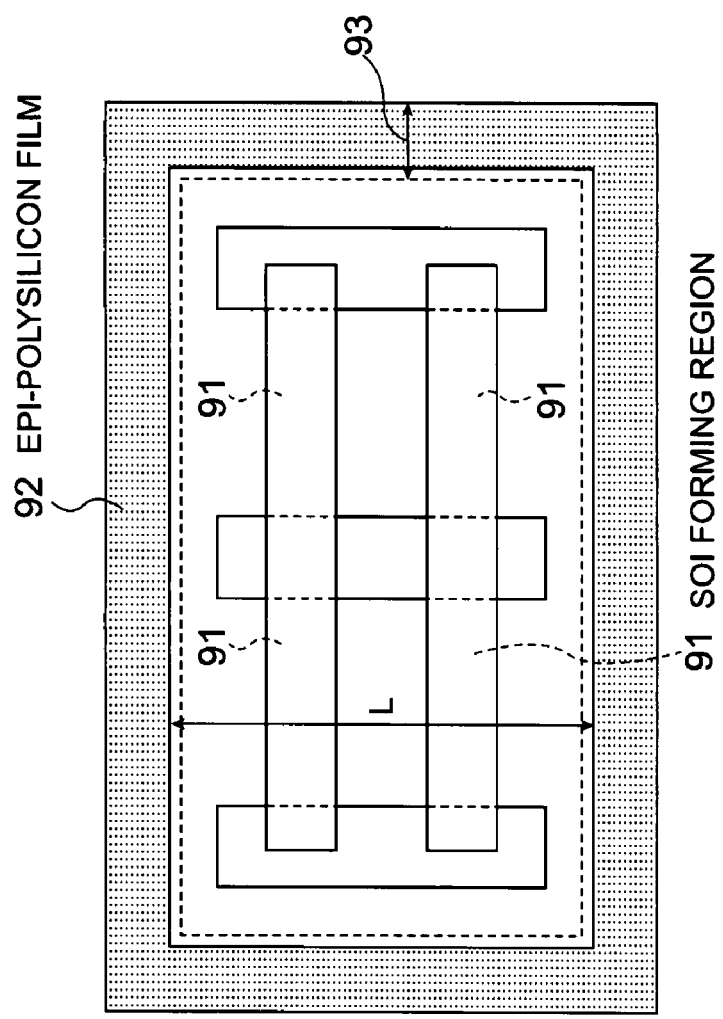
FIG. 8 is a drawing showing an example of related art.

FIG. 6 and FIG. 7 are plan views showing processes of a method for manufacturing a semiconductor device according to a third embodiment of the invention. More particularly, FIG. 6 is a plan view of a semiconductor device in which an isolation layer 13" has been formed on a silicon substrate, and FIG. 7 is a plan view of the semiconductor device in which the whole upper face of the silicon substrate has been treated with the CMP. Identical numerals are given to the same components and parts having the same structures as those shown in FIG. 1A and FIG. 3A, and those detailed descriptions will be hereunder omitted.

In the third embodiment, the isolation layer 13" is formed on the silicon substrate by the LOCOS method in the same manner as the first embodiment. However, the isolation layer 13" has a planar shape that encloses a single SOI forming region 1 and the opening forming regions 2a, 2b, and has the protruding parts 13a, 13b that partially protrude in the vertical direction when it is viewed in plan and toward the SOI forming region 1 in the enclosed area as shown in FIG. 6. The opening forming regions 2a, 2b are situated correspondingly adjacent to the two opposing sides among the four sides of the SOI forming region 1. In other words, the planar shape of the isolation layer 13" further has the protruding parts 13a, 13b added to the isolation layer 13 described in the first embodiment, and the planar shape of the isolation layer 13" isolates the SOI forming region 1. After the isolation layer 13" has formed on the silicon substrate, the SOI structures are formed in the SOI forming region 1 by the SBSI method in the same way as the first embodiment.

Accordingly, an epi-polysilicon film 24" formed on the isolation layer 13" has a planar shape that encloses the single SOI forming region 1 and the opening forming regions 2a, 2b, and has the protruding parts 13a, 13b that partially protrude in the vertical direction when it is viewed in plan and toward the SOI forming region 1 in the enclosed area as shown in FIG. 7. With such arrangement, it is possible to make a layout distance L3 between the two epi-polysilicon films 24" placed with the SOI forming region 1 therebetween smaller than the layout distance L1 (see FIG. 3A) of the first embodiment. Consequently, the degree of the dishing in the SOI forming region 1 can be reduced and this prevents unintended decrease in a thickness of the Si layer 23 in the SOI forming region 1.

In the third embodiment, the isolation layer 13" corresponds to the "insulating layer" of the invention and the epi-polysilicon film 24" corresponds to the "polycrystalline layer" of the invention. Other correspondences between the elements in the second embodiment and the elements of the invention are same as those in the first embodiment.

What is claimed is:

1. A semiconductor device, comprising:
a semiconductor base material;
an insulating layer selectively formed on the semiconductor base material;
a first semiconductor layer made of single-crystal and formed on the semiconductor base material that is exposed below the insulating layer, the first semiconductor layer having an opening that exposes the semiconductor base material;
a second semiconductor layer made of a single-crystal whose wet-etching selectivity is smaller than a wet-etching selectivity of the first semiconductor layer, the second semiconductor layer being formed on the first semiconductor layer and having the opening that exposes the semiconductor base material;
a polycrystalline layer made of the same composition as the second semiconductor layer, the polycrystalline layer being formed on the insulating layer;
a support film formed on a whole upper face of the semiconductor base material and filling the opening;
a mask pattern formed on the support film so as to continuously cover at least a part of the opening and a silicon-on-insulator (SOI) forming region, cover the polycrystalline layer and expose other region;
an opening plane exposing a side face of the first semiconductor layer and provided below the support film, the opening plane being formed by sequentially dry-etching the support film, the second semiconductor layer and the first semiconductor layer by using the mask pattern as a mask;
a portion defining a hollow part between the second semiconductor layer and the semiconductor base material, the hollow part being formed by wet-etching the first semiconductor layer through the opening plane;
a first insulating film formed in the hollow part; and
a second insulating film formed above the semiconductor base material on which the first insulating film is formed, the second insulating film being treated with chemical mechanical polishing (CMP) so as to expose the polycrystalline layer,
wherein the SOI forming region is provided in a plural number, and the insulating layer has a planar shape that encloses the SOI forming regions and separates one of the SOI forming regions from other SOI forming region in the enclosed area.

2. A semiconductor device, comprising:
a semiconductor base material;
an insulating layer selectively formed on the semiconductor base material;
a first semiconductor layer made of single-crystal and formed on the semiconductor base material that is exposed below the insulating layer, the first semiconductor layer having an opening that exposes the semiconductor base material;
a second semiconductor layer made of a single-crystal whose wet-etching selectivity is smaller than a wet-etching selectivity of the first semiconductor layer, the second semiconductor layer being formed on the first semiconductor layer and having the opening that exposes the semiconductor base material;
a polycrystalline layer made of the same composition as the second semiconductor layer, the polycrystalline layer being formed on the insulating layer;

a support film formed on a whole upper face of the semiconductor base material and filling the opening;

a mask pattern formed on the support film so as to continuously cover at least a part of the opening and a silicon-on-insulator (SOI) forming region, cover the polycrystalline layer and expose other region;

an opening plane exposing a side face of the first semiconductor layer and provided below the support film, the opening plane being formed by sequentially dry-etching the support film, the second semiconductor layer and the first semiconductor layer by using the mask pattern as a mask;

a portion defining a hollow part between the second semiconductor layer and the semiconductor base material, the hollow part being formed by wet-etching the first semiconductor layer through the opening plane;

a first insulating film formed in the hollow part; and a second insulating film formed above the semiconductor base material on which the first insulating film is formed, the second insulating film being treated with chemical mechanical polishing (CMP) so as to expose the polycrystalline layer, wherein the insulating layer has a planar shape that encloses the SOI forming region and has a protruding part partially protruding toward the SOI forming region in the enclosed area.

3. A semiconductor device, comprising:

a semiconductor base material;

an insulating layer selectively formed on the semiconductor base material;

a first semiconductor layer made of single-crystal and formed on the semiconductor base material that is exposed below the insulating layer, the first semiconductor layer having an opening that exposes the semiconductor base material;

a second semiconductor layer made of a single-crystal whose wet-etching selectivity is smaller than a wet-etching selectivity of the first semiconductor layer, the second semiconductor layer being formed on the first semiconductor layer and having the opening that exposes the semiconductor base material;

a polycrystalline layer made of the same composition as the second semiconductor layer, the polycrystalline layer being formed on the insulating layer;

a support film formed above a whole upper face of the semiconductor base material and filling the opening;

a mask pattern formed on the support film so as to continuously cover at least a part of the opening and a silicon-on-insulator (SOI) forming region, cover the polycrystalline layer and expose other region;

an opening plane exposing a side face of the first semiconductor layer and provided below the support film, the opening plane being formed by sequentially dry-etching the support film, the second semiconductor layer and the first semiconductor layer by using the mask pattern as a mask;

a portion defining a hollow part between the second semiconductor layer and the semiconductor base material, the hollow part being formed by wet-etching the first semiconductor layer through the opening plane;

a first insulating film formed in the hollow part; and a second insulating film formed above the semiconductor base material on which the first insulating film is formed, the second insulating film being treated with chemical mechanical polishing (CMP) so as to expose the polycrystalline layer, wherein the SOI forming region is provided in a plural number, and the insulating layer has a planar shape that encloses the SOI forming regions, separates a first SOI forming region, which is one of the SOI forming regions, from other SOI forming region in the enclosed area, and has a protruding part partially protruding toward at least one of the first SOI forming region or the other SOI forming region.

4. A method for manufacturing a semiconductor device, comprising:

forming an insulating layer on a semiconductor base material;

forming a first semiconductor layer made of single-crystal on the semiconductor base material that is exposed below the insulating layer;

forming a second semiconductor layer made of a single-crystal whose wet-etching selectivity is smaller than a wet-etching selectivity of the first semiconductor layer on the first semiconductor layer, and simultaneously forming a polycrystalline layer made of the same composition as the second semiconductor layer on the insulating layer;

forming an opening that exposes the semiconductor base material in the second semiconductor layer and the first semiconductor layer;

filling the opening by forming a support film above a whole upper face of the semiconductor base material;

forming a mask pattern on the support film so as to continuously cover at least a part of the opening and a silicon-on-insulator (SOI) forming region, cover the polycrystalline layer and expose other region;

forming an opening plane that exposes a side face of the first semiconductor layer and is placed below the support film by sequentially dry-etching the support film, the second semiconductor layer and the first semiconductor layer by using the mask pattern as a mask;

forming a hollow part between the second semiconductor layer and the semiconductor base material by wet-etching the first semiconductor layer through the opening plane;

forming a first insulating film in the hollow part; and forming a second insulating film above the semiconductor base material on which the first insulating film is formed, and treating the second insulating film with chemical mechanical polishing (CMP) so as to expose the polycrystalline layer, wherein the SOI forming region is provided in a plural number, and the insulating layer is formed so as to have a planar shape that encloses the SOI forming regions and separates one of the SOI forming regions from other SOI forming region in the enclosed area.

5. A method for manufacturing a semiconductor device, comprising:

forming an insulating layer on a semiconductor base material;

forming a first semiconductor layer made of single-crystal on the semiconductor base material that is exposed below the insulating layer;

forming a second semiconductor layer made of a single-crystal whose wet-etching selectivity is smaller than a wet-etching selectivity of the first semiconductor layer on the first semiconductor layer, and simultaneously forming a polycrystalline layer made of the same composition as the second semiconductor layer on the insulating layer;

forming an opening that exposes the semiconductor base material in the second semiconductor layer and the first semiconductor layer;

filling the opening by forming a support film above a whole upper face of the semiconductor base material;

forming a mask pattern on the support film so as to continuously cover at least a part of the opening and a silicon-on-insulator (SOI) forming region, cover the polycrystalline layer and expose other region;

forming an opening plane that exposes a side face of the first semiconductor layer and is placed below the support film by sequentially dry-etching the support film, the second semiconductor layer and the first semiconductor layer by using the mask pattern as a mask;

forming a hollow part between the second semiconductor layer and the semiconductor base material by wet-etching the first semiconductor layer through the opening plane;

forming a first insulating film in the hollow part; and forming a second insulating film above the semiconductor base material on which the first insulating film is formed, and treating the second insulating film with chemical mechanical polishing (CMP) so as to expose the polycrystalline layer, wherein the insulating layer is formed so as to have a planar shape that encloses the SOI forming region and have a protruding part partially protruding toward the SOI forming region in the enclosed area.

* * * * *